United States Patent
Dubois et al.

(10) Patent No.: US 9,520,528 B2
(45) Date of Patent: Dec. 13, 2016

(54) DEVICE AND METHOD FOR RESTORING SILICON-BASED PHOTOVOLTAIC SOLAR CELLS

(71) Applicant: COMMISSARIAT À L'ENERGIE ATOMIQUE ET AUX ENERGIES ALTERNATIVES, Paris (FR)

(72) Inventors: Sébastien Dubois, Scionzier (FR); Nicolas Enjalbert, Burlats (FR); Jean-Paul Garandet, Le Bourget du Lac (FR); Pierre Gidon, Echirolles (FR); Florent Tanay, Grenoble (FR); Jordi Veirman, Poisy (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/428,555

(22) PCT Filed: Sep. 16, 2013

(86) PCT No.: PCT/FR2013/000240
§ 371 (c)(1),
(2) Date: Mar. 16, 2015

(87) PCT Pub. No.: WO2014/041260
PCT Pub. Date: Mar. 20, 2014

(65) Prior Publication Data
US 2015/0236190 A1    Aug. 20, 2015

(30) Foreign Application Priority Data
Sep. 14, 2012 (FR) ...................................... 12 02454

(51) Int. Cl.
*H01L 31/18* (2006.01)
*H01L 31/04* (2014.01)

(52) U.S. Cl.
CPC ............. *H01L 31/186* (2013.01); *H01L 31/04* (2013.01); *H01L 31/18* (2013.01); *H01L 31/1804* (2013.01); *H01L 31/1864* (2013.01)

(58) Field of Classification Search
None
See application file for complete search history.

(56) References Cited

U.S. PATENT DOCUMENTS

| 3,026,710 | A | * | 3/1962 | Lupfer | ................... G01N 11/14 |
| | | | | | 374/17 |
| 6,344,301 | B1 | * | 2/2002 | Akutsu | .................. C25D 13/04 |
| | | | | | 257/59 |
| 2008/0035489 | A1 | * | 2/2008 | Allardyce | ........... C23C 18/1605 |
| | | | | | 205/263 |

FOREIGN PATENT DOCUMENTS

| CN | 201450015 U | 5/2010 |
| DE | 102009059300 A1 | 6/2011 |

(Continued)

OTHER PUBLICATIONS

Nov. 4, 2013 International Search Report issued in International Patent Application No. PCT/FR2013/000240.

(Continued)

*Primary Examiner* — Cheung Lee
(74) *Attorney, Agent, or Firm* — Oliff PLC (57) ABSTRACT

A restoration device of at least one silicon-based photovoltaic solar cell is provided with a support of the cell and a charge carriers generator configured to generate charge carriers in the photovoltaic solar cell. The device is further provided with a tank designed to be filled by a liquid, and the support is configured to place the photovoltaic solar cell in the liquid.

56 Claims, 3 Drawing Sheets (56) References Cited

FOREIGN PATENT DOCUMENTS

| | | |
|---|---|---|
| JP | 2003332598 A | 11/2003 |
| WO | 2007/107351 A1 | 9/2007 |

OTHER PUBLICATIONS

Lee; "Rapid thermal processing of silicon solar cells—passivation and diffusion;" Dissertation; Jan. 1, 2003; pp. 35-64.

* cited by examiner

DEVICE AND METHOD FOR RESTORING SILICON-BASED PHOTOVOLTAIC SOLAR CELLS

BACKGROUND OF THE INVENTION

The invention relates to a device and a method designed to eliminate the degradation effects of the efficiency under illumination of silicon-based photovoltaic solar cells.

STATE OF THE ART

Photovoltaic solar cells manufactured from substrates made from amorphous silicon (a-Si), monocrystalline silicon (sc-Si) or multicrystalline silicon (mc-Si) can undergo a degradation effect of the efficiency under illumination. This phenomenon occurs during the first uses of the photovoltaic solar cells, and it is usually called LID effect (LID standing for Light Induced Degradation). The physical mechanisms at the origin of this degradation of the efficiency of photovoltaic solar cells under illumination do however remain incompletely known. Furthermore, several scientific studies have shown that light elements present in the silicon, in particular hydrogen (H), boron (B) and oxygen (O) atoms, generally participate in formation and in activation of defects when the photovoltaic solar cells are illuminated.

The LID effects can be eliminated by injecting charge carriers into the photovoltaic solar cells while at the same time heating said cells. International Patent application WO 2007/107351 discloses a method aiming to achieve stabilisation of the efficiency of photovoltaic solar cells when the latter are illuminated. In this document, the restoration method of the cells comprises a charge carrier injection step via an illumination or a forward polarisation of the photovoltaic solar cell and a heating step of the substrate to a temperature comprised between 50° C. and 230° C. This restoration method enabled the treated photovoltaic solar cell to recover stable performances under normal operating conditions. However, this type of restoration method requires precise control of the temperature. The restoration effects do in fact only take place if the temperature of the photovoltaic solar cells does not exceed a certain limit temperature which is typically about 200° C. or even a lower temperature. The performances of certain silicon-based photovoltaic solar cells can in fact be affected when they are maintained at temperatures of more than 150° C.

Furthermore, the method described in the document referenced above requires very long treatment times for complete restoration of the photovoltaic solar cells. What is meant by treatment times is the time during which the solar cells are kept at a certain temperature when generation of charge carriers in the cells is performed. The treatment times can be as long as a hundred hours or so, which makes this method incompatible with conventional industrial manufacturing methods of photovoltaic solar cells.

Treatments have in fact been performed, by means of the method described in this document, to restore the efficiency of solar cells produced from substrates made from silicon purified by metallurgical means. For this type of solar cells, the restoration mechanisms required between 10 and 40 hours for high temperatures comprised between 150 and 180° C.

Furthermore, the restoration kinetics of the photovoltaic solar cells can be accelerated by increasing the quantity of charge carriers injected into the treated photovoltaic solar cell. This increase can be achieved in particular by increasing the power of the incident illumination or the intensity of the electric current input to the cell. However, increasing the incident lighting power or the input electric current results in a very large increase of the temperature of the photovoltaic solar cell, limiting or even completely counteracting the restoration effects of the photovoltaic solar cell.

Utility model application CN201450015 describes a device for heating and illuminating silicon-based solar cells to restore them. The device comprises a system of fans to cool the photovoltaic solar cells when the treatment is performed. However, the use of a fan-based system does not enable solar cells of good quality to be obtained. In particular, it was observed that this type of device can generate problems of mechanical stresses, thereby creating microcracks in the photovoltaic solar cells.

OBJECT OF THE INVENTION

A requirement exists to provide an effective device to restore silicon-based photovoltaic solar cells to counteract degradation of the efficiency under illumination, while at the same time preserving the mechanical integrity and the photovoltaic performances of the treated cells.

This requirement tends to be satisfied by providing a restoration device of at least one silicon-based photovoltaic solar cell, said device comprising a support of the photovoltaic solar cell, and means for generating charge carriers in the photovoltaic solar cell. The device further comprises a tank designed to be filled by a liquid, and the support is configured to place the photovoltaic solar cell in the liquid.

A method is also provided for performing restoration of at least one silicon-based photovoltaic solar cell to counteract degradation of the efficiency under illumination by generating charge carriers in the cell. The method comprises a step wherein the photovoltaic solar cell is immersed in a liquid when charge carrier generation is performed in the photovoltaic solar cell, so as to regulate the temperature of the photovoltaic solar cell to a target temperature value or range comprised in the 50° C.-230° C. temperature range.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS

The device for healing silicon-based photovoltaic solar cells described in the following differs from the prior art in particular in that it provides elements enabling the temperature of the photovoltaic solar cells to be regulated when the restoration method is implemented in order to increase the restoration kinetics of the treated cells.

Figure 1:
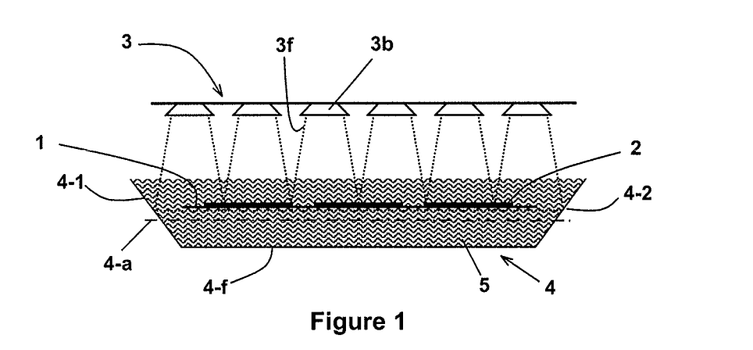
FIGS. 1 to 4 and 6 schematically illustrate devices according to different embodiments, in cross-section.

According to a particular embodiment illustrated in FIG. 1, a restoration device of silicon-based photovoltaic cells comprises a support 1 of at least one photovoltaic solar cell 2. The restoration device also comprises means 3 for generating charge carriers in photovoltaic solar cell 2, and preferentially a heat source (not shown) configured to heat photovoltaic solar cell 2.

Charge carrier generating means 3 can for example comprise a light source illuminating photovoltaic solar cell 2 and/or means for injecting an electric current into photovoltaic solar cell 2. In FIG. 1, charge carrier generating means 3 are represented as being a light source 3*b* illuminating photovoltaic solar cell 2 by a light beam 3*f*. Charge carrier generating means 3 can also constitute the heat source of the restoration device. For example, halogen lamps can constitute both the charge carrier generating means and the heat source.

The restoration device enables photovoltaic solar cell 2 to be heated while at the same time injecting charge carriers into it to restore said cell from the effects of degradation of the efficiency under illumination.

In order to increase the efficiency of restoration and to accelerate its kinetics, the device comprises a tank 4 designed to be filled by a liquid 5. Support 1 is further configured to place photovoltaic solar cell 2 in liquid 5. The cell is in particular totally immersed in liquid 5. Tank 4 comprises a bottom 4-*f* and side walls. In a particular embodiment, the side walls comprise a first side wall 4-1 arranged at the level of a first end of tank 4 and a second side wall 4-2 arranged at the level of a second end opposite the first end in a longitudinal direction 4-*a* of arrangement of solar cells 2.

The restoration device provided with tank 4 advantageously enables an efficient and homogenous dissipation of the temperature of photovoltaic solar cell 2 when charge carriers are injected, including when a large injection of charge carriers is performed. A large injection of charge carriers enables the restoration kinetics to be accelerated, thereby reducing the treatment time of the photovoltaic cells. Due to liquid 5 submerging photovoltaic solar cell 2, the temperature increase generated by the injected quantity of charge carriers is efficiently dissipated, which enables temperature regulation of the photovoltaic solar cell to be obtained while at the same time preventing thermomechanical stress problems. The healing device thus enables rapid and efficient restoration of the silicon-based photovoltaic cells to be performed, while at the same time preserving the mechanical integrity of said cells.

In the embodiment described above, the restoration device preferentially comprises a heat source configured to heat the photovoltaic solar cell. Nevertheless, the heat source can be optional; the photovoltaic solar cell could just as well be heated directly by liquid 5.

Figure 2:
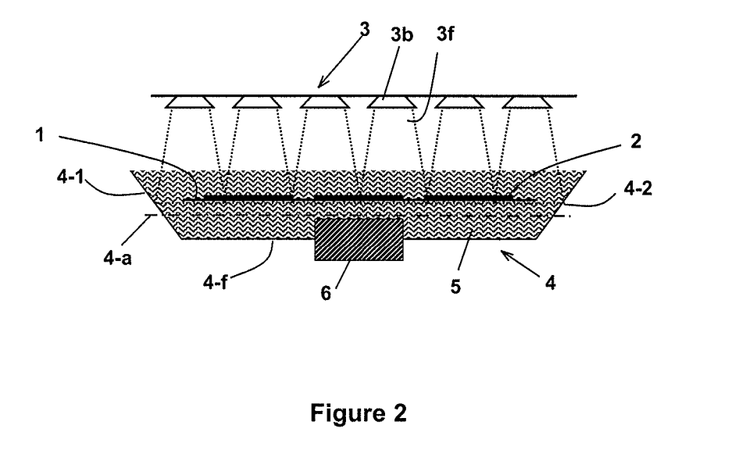

In a particular embodiment illustrated in FIG. 2, tank 4 of the restoration device comprises a regulator 6 of the temperature of liquid 5. Regulator 6 can for example comprise thermoelectric devices or electric resistance heaters arranged in the walls of tank 4 and controlled by a control circuit not represented in FIG. 2.

Regulator 6 enables the temperature of liquid 5 in tank 4, and therefore the temperature of photovoltaic solar cell 2, to be controlled with precision. Regulator 6 thereby enables the temperature of photovoltaic solar cell 2 to be regulated to a target temperature value or range when charge carrier injection is performed. Advantageously, regulator 6 of the temperature of liquid 5 is configured to regulate the temperature of photovoltaic solar cell 2 to a particular temperature value (for example to 170° C.) or within a particular temperature range (for example between 120° C. and 190° C.). Whether the regulation concerns a given temperature value or a temperature range, the target temperature value or range nevertheless always remains comprised within the 50° C.-230° C. temperature range. For silicon-based photovoltaic cells, the restoration effects can in fact only be achieved if the temperature of the cell is comprised within this temperature range. The 50° C.-230° C. temperature range thus enables rapid and efficient restoration of photovoltaic cells 2 to be achieved, eliminating the effects of degradation of the efficiency under illumination, while at the same time preserving the photovoltaic performances of the treated cells.

Thermocouples can further be fitted over the whole length of the device in order to control the temperature of liquid 5 and/or of photovoltaic solar cells 2 with precision.

Figure 3:
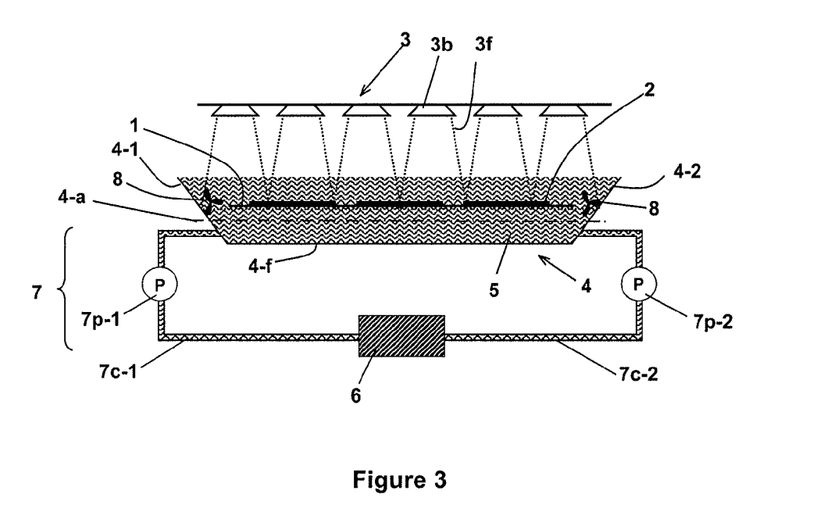

In a particular embodiment illustrated in FIG. 3, tank 4 comprises circulation means 7 for making liquid 5 circulate in tank 4. Circulation means 7 of liquid 5 comprise a first pipe 7*c*-1 and a second pipe 7*c*-2 connected to one another at one of their ends. First pipe 7*c*-1 can be connected to tank 4 via an opening formed in first side wall 4-1. The second pipe is connected to tank 4 via an opening preferentially formed in second side wall 4-2. In order to make liquid 5 circulate in tank 4, first pipe 7*c*-1 can for example comprise a first pump 7*p*-1 configured to suck liquid 5 from tank 4 to second pipe 7*c*-2 which comprises a second pump 7*p*-2. Second pump 7*p*-2 is configured to inject liquid 5 into tank 4. This configuration of first pipe 7*c*-1 and second pipe 7*c*-2 enables flow of liquid 5 in tank 4 along longitudinal axis 4-*a*.

Flow of liquid 5 in tank 4 advantageously enables a better homogenisation of the temperature of liquid 5 in tank 4, which enables a better dissipation of the heat from photovoltaic solar cell 2 to liquid 5. In advantageous manner, circulation means 7 are connected to temperature regulator 6 of liquid 5. According to this embodiment, temperature regulator 6 is configured so as to control the temperature of liquid 5 injected into tank 4 via second pipe 7*c*-2. Preferentially, the control circuit of temperature regulator 6 also controls first pump 7*p*-1 and second pump 7*p*-2. Advantageously, the control circuit is configured to define the temperature of photovoltaic solar cell 2 or a temperature range authorised for the solar cell.

In advantageous manner, tank 4 can comprise a mechanical stirring circuit 8 of liquid 5 in tank 4. Preferentially, this stirring circuit 8 is associated with circulation means of liquid 5 in tank 4. Mechanical stirring means 8 can comprise at least one propeller arranged in tank 4, for example on one of the side walls. Tank 4 can further also comprise an ultrasonic transducer. The ultrasonic transducer is preferentially located in the tank so as to be as close as possible to photovoltaic solar cell 2 to be treated. In order not to disturb propagation of the ultrasonic waves to photovoltaic solar cell 2, the transducer is preferentially arranged in such a way as to avoid any solid obstacle, such as support 1, between the ultrasonic transducer and said cell. The ultrasonic transducer advantageously enables generation of a convection movement in liquid 5, thus resulting in stirring of the liquid and a homogenisation of its temperature. Furthermore, the transducer generates ultrasonic waves which can enhance the diffusion, reorientation and dissociation effects of the defects and impurity complexes, thereby further accelerating the restoration kinetics.

Figure 4:
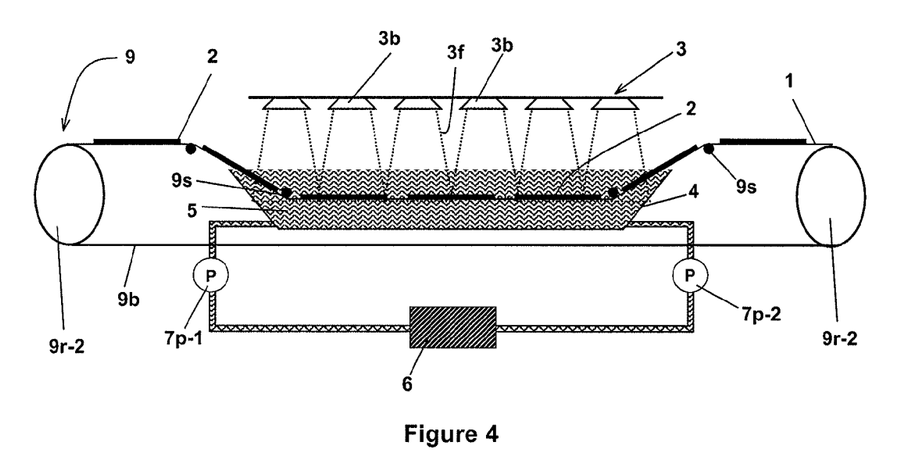
Figure 5:
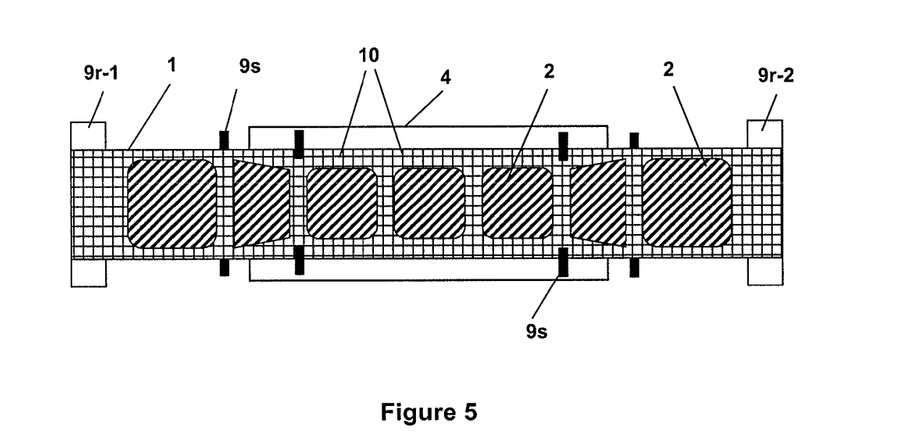
FIG. 5 schematically illustrates a top view of the device of FIG. 4.

According to an embodiment illustrated in FIGS. 4 and 5, the restoration device comprises movement means 9 for moving support 1 in tank 4. Movement means 9 are configured to make photovoltaic solar cell 2 move in a direction parallel to the surface of liquid 5 in tank 4. Support 1 is shaped in such a way as to ensure that photovoltaic solar cells 2 are maintained in stable manner on its surface. Movement means 9 of support 1 can be of the conveyor belt type. Preferentially, movement means 9 can comprise first 9*r*-1 and second 9*r*-2 main rollers around which support 1 is wound to form a closed loop 9b. Movement means 9 further comprise secondary rollers 9s configured to modify the axis of translation of support 1 when movement of the latter takes place along the path of closed loop 9b. As illustrated in FIG. 5, secondary rollers 9s are in contact only with the edges of support 1. This arrangement prevents any contact between secondary rollers 9s and photovoltaic solar cells 2 when movement of support 1 takes place. Furthermore, at least one of the two main rollers 9r-1 and 9r-2 is a drive roller configured to make support 1 move following the path of closed loop 9b.

This configuration of the restoration device thereby enables accelerated restoration of several photovoltaic cells arranged for example following one another or side by side on rolling support 1. The restoration device can thus easily integrate a large-scale production line.

Advantageously, first main roller 9r-1 is an idler roller and second main roller 9r-2 is a drive roller. In preferential manner, the drive roller is configured to obtain a direction of movement of support 1 opposite to the direction of movement of liquid 5 in tank 4. These opposite movements of support 1 and of liquid 5 then enable a better heat dissipation from photovoltaic solar cells 2 to liquid 5 and enhance stirring of liquid 5.

According to an embodiment illustrated in FIG. 5, support 1 comprises pass-through holes 10 so that liquid 5 is in contact with the surface of photovoltaic solar cell 2 located on support 1. This configuration of support 1 increases the contact surface between photovoltaic solar cells 2 and liquid 5 when the cells are immersed in tank 4. The increase of the contact surface between liquid 5 and photovoltaic solar cells 2 then advantageously enables better heat exchanges to be ensured between cells 2 and liquid 5. Furthermore, it is also advantageous for support 1 to be formed by a material having a higher thermal conductivity $\lambda_s$ than the thermal conductivity of photovoltaic solar cell $\lambda_c$. Support 1 is preferentially formed by flexible stainless steel meshes.

Advantageously, the restoration device comprises a general control circuit (not illustrated in the figures) configured to control:
  temperature regulator 6 of liquid 5 in tank 4;
  means 3 for generating charge carriers injected into photovoltaic solar cell 2.

The general control circuit is configured to regulate the temperature of photovoltaic solar cell 2 to a stable value or to a temperature comprised in the 50° C.-230° C. range, and advantageously in the 120° C.-210° C. temperature range. The general control circuit also preferentially controls the speed of movement of support 1 in tank 4, and the stirring means.

As illustrated in FIGS. 1 to 4, charge carrier generating means 3 comprise a light source 3b designed to illuminate photovoltaic solar cell 2. Light source 3b can comprise monochromatic lamps producing an incident light beam having a wavelength comprised between 300 and 1300 nm. Light source 3b can also comprise halogen or xenon lamps enabling a white light to be produced. Light source 3b is preferentially configured to provide an intense illumination so that the photovoltaic cells receive an illumination of more than 0.05 W·cm$^{-2}$. Light source 3b can further comprise a laser source which advantageously generates an intense illumination. The use of a laser source advantageously enables a reduction of the power consumption to be achieved in comparison with other light sources.

Figure 6:
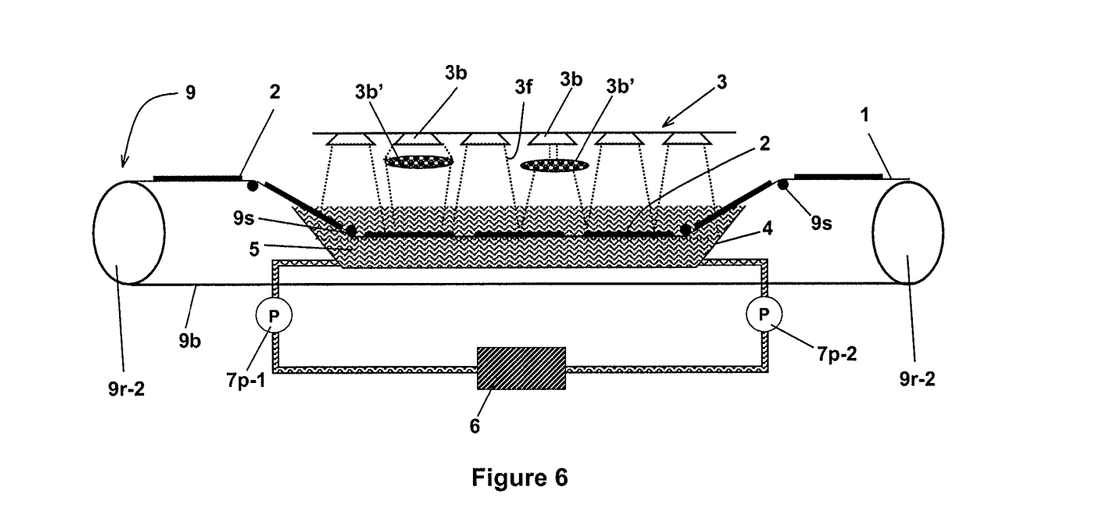

According to a particular embodiment illustrated in FIG. 6, light source 3b comprises an optic system 3b' arranged between the photovoltaic solar cells and light source 3b. For example, when light source 3b is a laser source, it is advantageous to use a diverging lens as optic system 3b'. A diverging lens thus enables the surface of the photovoltaic solar cell receiving the illumination to be increased. When the light source is formed by a halogen lamp or a monochromatic lamp on the other hand, it is advantageous to use a converging lens as optic system to concentrate the light beam and increase the illumination intensity received by photovoltaic solar cell 2.

According to an embodiment not illustrated in the figures, charge carrier generating means 3 can comprise means for injecting an electric current into photovoltaic solar cell 2. For example, the restoration device comprises point probes connected to a potential difference source. Said point probes are configured to come into contact with photovoltaic solar cell 2 to inject an electric current into the latter. The means for injecting an electric current can comprise means for moving the point probes configured so that the point probes and support 1 have the same movement. The point probes can thus be considered as being fixed elements with respect to photovoltaic solar cell 2 in movement.

Conventional restoration methods of photovoltaic solar cells are performed by heating the cells in a conventional furnace (or heating plate) while generating a quantity of charge carriers in the cells. Such equipment does not however enable a sufficiently efficient dissipation of the heat input by generation of the charge carriers. Intense illumination of the cells, indispensable for rapid restoration of the cells, does in fact inevitably result in a very large increase of the temperature of the photovoltaic solar cells, which in conventional methods is very difficult to control and to regulate to the required temperature.

According to a particular embodiment of a restoration method of at least one silicon-based photovoltaic solar cell to eliminate the degradation effects of the efficiency under illumination, the stresses on the step of generating charge carriers in the cells are relaxed.

Preferentially, the method uses one of the restoration devices described above and illustrated in FIGS. 1 to 6. The restoration method comprises a step wherein at least one photovoltaic solar cell 2 made in a silicon-based (amorphous, monocrystalline or multicrystalline) substrate or active layer is provided. The restoration method is performed by immersing the photovoltaic solar cell 2 in a liquid 5 when generation of charge carriers in said cell 2 takes place, so as to regulate the temperature of photovoltaic solar cell 2 to a target temperature value or range comprised in the 50° C.-230° C. and advantageously in the 120° C.-210° C. temperature range. Heating of photovoltaic solar cell 2 can be performed by a heat source or by charge carrier generating means 3, for example by halogen lamps. Preferentially, to execute the method, the restoration device comprising temperature regulator 6 of liquid 5 is used.

In fact, depending on the type of generating means 3, by illumination or by electric current input, liquid 5 can be either transparent to the emitted light beam or electrically insulating. Preferentially, the charge carriers are injected into photovoltaic solar cell 2 by generating means 3 comprising a light source 3b, and liquid 5 is transparent to light beam 3f emitted by said source 3b.

Liquid 5 can be chosen according to its physico-chemical properties, in particular the specific heat capacity, latent vaporisation heat, thermal conductivity, and viscosity.

Advantageously, liquid 5 does not present any toxicity problems and does not affect the performances of the silicon-based photovoltaic solar cells. Furthermore, the wettability criterion of liquid 5 on photovoltaic solar cell 2 is also a criterion liable to be taken into account. This criterion can in fact play a role in ensuring an efficient heat transfer between liquid 5 and photovoltaic solar cell 2. Advantageously, liquid 5 has a contact angle with cell 2 that is less than 90° and preferably about 45°. To perform the restoration method, liquid 5 used for regulating the temperature of the photovoltaic solar cell is advantageously chosen so as not to evaporate during the restoration treatment. The choice of the liquid used is thus intimately linked to the criteria set out above, but also to the temperature range in which the restoration method is performed. As described in the foregoing, the restoration method is advantageously performed at a target temperature value or in a temperature range comprised within the 50° C.-230° C. temperature range. In advantageous manner, liquid 5 has a boiling temperature strictly higher than 100° C. and advantageously higher than or equal to about 230° C.

For example, liquid 5 can be chosen from the family of heat transfer liquids. This type of liquid distinguishes itself by its ability to regulate the temperature of its environment. Advantageously, liquid 5 is ethylene glycol or glycerol. Ethylene glycol is a non-toxic heat transfer fluid which has a boiling temperature of 198° C. Glycerol is a non-toxic liquid which has a boiling temperature of 290° C., but it does however begin to decompose at a temperature of more than 171° C.

Furthermore, liquid 5 can be a soluble cutting oil which notably comprises a mineral oil, an emulsifier and water. Cutting oils have interesting physical characteristics. Cutting oils are in fact generally transparent and have a viscosity close to that of water. In addition, this type of liquid has an interesting cooling power, and it remains in liquid state for temperatures of more than 100° C.

The restoration method advantageously enables the stress on the charge carrier generating step to be relaxed to increase the restoration kinetics of the photovoltaic cells to repair the effects of degradation of the efficiency under illumination. The method thus enables the intensity of charge carrier generation in the cell to be increased, while regulating the temperature to a temperature suitable for obtaining stable healing.

For example, a photovoltaic solar cell restoration device was produced according to the invention. The charge carrier generating means are formed by halogen lamps enabling the photovoltaic solar cell to receive an illumination of an intensity of 3 $W \cdot cm^{-2}$. Using conventional restoration devices, the temperature of the photovoltaic solar cell cannot be maintained below 145° C. when the photovoltaic solar cell receives an illumination intensity of more than a few one-tenths of $W \cdot cm^{-2}$.

For the restoration method, temperature-regulated ethylene glycol was used to regulate the temperature of the treated cell to a temperature substantially equal to 145° C. The method according to the invention enabled the cell to be restored using an intense illumination (3 $W \cdot cm^{-2}$), after only 4 minutes of treatment. For comparison purposes, restoration methods according to the prior art showed that the healing mechanisms took place between 10 and 40 hours of treatment. These tests were carried out by heating the cells to a temperature comprised between 150° C. and 180° C. with an illumination of 0.1 $W \cdot cm^{-2}$.

Furthermore, the restoration device and method described above can be applied to one or more photovoltaic solar cells, which can be placed in a module or not.

The invention claimed is:

1. A restoration device of at least one silicon-based photovoltaic solar cell, said device comprising:
a support of the photovoltaic solar cell;
a charge carriers generator configured so as to generate charge carriers in the photovoltaic solar cell;
a tank designed to be filled by a liquid, wherein the liquid is a heat transfer liquid or a soluble cutting oil; and
a regulator of a liquid temperature, wherein the regulator is configured to regulate the temperature of the photovoltaic solar cell to a target temperature value or range comprised within the 50° C.-230° C. temperature range,
wherein the support is configured to arrange the photovoltaic solar cell in the liquid.

2. The device according to claim 1, wherein the tank comprises the regulator of the liquid temperature.

3. The device according to claim 1, wherein the regulator comprises electric resistance heaters and/or thermoelectric devices arranged in the walls of the tank.

4. The device according to claim 1, wherein the tank comprises a liquid circulation system.

5. The device according to claim 1, wherein the tank comprises a mechanical stirring system of configured to stir the liquid in the tank.

6. The device according to claim 1, comprising a support movement system configured to move the photovoltaic solar cell in a direction parallel to the surface of the liquid in the tank.

7. The device according to claim 1, wherein the support comprises pass-through holes so that the liquid is in contact with a surface of the photovoltaic solar cell arranged on the support.

8. The device according to claim 1, wherein the support is made from a material having a higher thermal conductivity than the thermal conductivity of the photovoltaic solar cell.

9. The device according to claim 1, wherein the charge carriers generator comprises a light source designed to illuminate the photovoltaic solar cell.

10. The device according to claim 9 wherein the light source comprises a laser source.

11. The device according to claim 10, comprising an optic system arranged between the light source and the photovoltaic solar cell.

12. The device according to claim 9, comprising an optic system arranged between the light source and the photovoltaic solar cell.

13. The device according to claim 1, wherein the charge carriers generator comprises an electric current injecting system configured to inject an electric current into the photovoltaic solar cell.

14. The device according to claim 1, wherein the liquid has a boiling temperature strictly higher than 100° C.

15. A restoration method of at least one silicon-based photovoltaic solar cell to counteract degradation of the efficiency under illumination, comprising:
generating charge carriers in said cell, and
immersing the photovoltaic solar cell in a liquid when generation of charge carriers takes place, so as to regulate the temperature of the photovoltaic solar cell to a target temperature value or range comprised within the 50° C.-230° C. temperature range.

16. The restoration method according to claim 15, wherein the liquid has a boiling temperature strictly higher than 100° C.

17. The restoration method according to claim 15, wherein the liquid comprises ethylene glycol or glycerol or a soluble cutting oil.

18. A restoration device of at least one silicon-based photovoltaic solar cell, said device comprising:
- a support of the photovoltaic solar cell;
- a charge carriers generator configured so as to generate charge carriers in the photovoltaic solar cell;
- a tank designed to be filled by a liquid; and
- a support movement system configured to move the photovoltaic solar cell in a direction parallel to the surface of the liquid in the tank wherein the support is configured to arrange the photovoltaic solar cell in the liquid.

19. The device according to claim 18, wherein the tank comprises a regulator of a liquid temperature.

20. The device according to claim 19, wherein the regulator is configured to regulate the temperature of the photovoltaic solar cell to a target temperature value or range comprised within the 50° C.-230° C. temperature range.

21. The device according to claim 20, wherein the regulator comprises electric resistance heaters and/or thermoelectric devices arranged in the walls of the tank.

22. The device according to claim 18, wherein the tank comprises a liquid circulation system.

23. The device according to claim 18, wherein the tank comprises a mechanical stirring system of configured to stir the liquid in the tank.

24. The device according to claim 18, wherein the support comprises pass-through holes so that the liquid is in contact with a surface of the photovoltaic solar cell arranged on the support.

25. The device according to claim 18, wherein the support is made from a material having a higher thermal conductivity than the thermal conductivity of the photovoltaic solar cell.

26. The device according to claim 18, wherein the charge carriers generator comprises a light source designed to illuminate the photovoltaic solar cell.

27. The device according to claim 26 wherein the light source comprises a laser source.

28. The device according to claim 27, comprising an optic system arranged between the light source and the photovoltaic solar cell.

29. The device according to claim 26, comprising an optic system arranged between the light source and the photovoltaic solar cell.

30. The device according to claim 18, wherein the charge carriers generator comprises an electric current injecting system configured to inject an electric current into the photovoltaic solar cell.

31. The device according to claim 18, wherein the liquid has a boiling temperature strictly higher than 100° C.

32. A restoration device of at least one silicon-based photovoltaic solar cell, said device comprising:
- a support of the photovoltaic solar cell;
- a charge carriers generator configured so as to generate charge carriers in the photovoltaic solar cell; and
- a tank designed to be filled by a liquid, wherein the support is configured to arrange the photovoltaic solar cell in the liquid, and the support comprising pass-through holes so that the liquid is in contact with a surface of the photovoltaic solar cell arranged on the support.

33. The device according to claim 32, wherein the tank comprises a regulator of a liquid temperature.

34. The device according to claim 33, wherein the regulator is configured to regulate the temperature of the photovoltaic solar cell to a target temperature value or range comprised within the 50° C.-230° C. temperature range.

35. The device according to claim 34, wherein the regulator comprises electric resistance heaters and/or thermoelectric devices arranged in the walls of the tank.

36. The device according to claim 32, wherein the tank comprises a liquid circulation system.

37. The device according to claim 32, wherein the tank comprises a mechanical stirring system of configured to stir the liquid in the tank.

38. The device according to claim 32, wherein the support is made from a material having a higher thermal conductivity than the thermal conductivity of the photovoltaic solar cell.

39. The device according to claim 32, wherein the charge carriers generator comprises a light source designed to illuminate the photovoltaic solar cell.

40. The device according to claim 39 wherein the light source comprises a laser source.

41. The device according to claim 40, comprising an optic system arranged between the light source and the photovoltaic solar cell.

42. The device according to claim 39, comprising an optic system arranged between the light source and the photovoltaic solar cell.

43. The device according to claim 32, wherein the charge carriers generator comprises an electric current injecting system configured to inject an electric current into the photovoltaic solar cell.

44. The device according to claim 32, wherein the liquid has a boiling temperature strictly higher than 100° C.

45. A restoration device of at least one silicon-based photovoltaic solar cell, said device comprising:
- a support of the photovoltaic solar cell;
- a charge carriers generator configured so as to generate charge carriers in the photovoltaic solar cell; and
- a tank designed to be filled by a liquid, wherein the support is configured to arrange the photovoltaic solar cell in the liquid, and the support is made from a material having a higher thermal conductivity than the thermal conductivity of the photovoltaic solar cell.

46. The device according to claim 45, wherein the tank comprises a regulator of a liquid temperature.

47. The device according to claim 46, wherein the regulator is configured to regulate the temperature of the photovoltaic solar cell to a target temperature value or range comprised within the 50° C.-230° C. temperature range.

48. The device according to claim 47, wherein the regulator comprises electric resistance heaters and/or thermoelectric devices arranged in the walls of the tank.

49. The device according to claim 45, wherein the tank comprises a liquid circulation system.

50. The device according to claim 45, wherein the tank comprises a mechanical stirring system of configured to stir the liquid in the tank.

51. The device according to claim 45, wherein the charge carriers generator comprises a light source designed to illuminate the photovoltaic solar cell.

52. The device according to claim 51 wherein the light source comprises a laser source.

53. The device according to claim 52, comprising an optic system arranged between the light source and the photovoltaic solar cell.

54. The device according to claim 51, comprising an optic system arranged between the light source and the photovoltaic solar cell.

55. The device according to claim 45, wherein the charge carriers generator comprises an electric current injecting system configured to inject an electric current into the photovoltaic solar cell.

56. The device according to claim 45, wherein the liquid has a boiling temperature strictly higher than 100° C.

* * * * *